(12) United States Patent
Jung

(10) Patent No.: US 10,499,041 B2
(45) Date of Patent: Dec. 3, 2019

(54) DISPLAY DEVICE

(71) Applicant: Samsung Display Co., Ltd., Yongin-si, Gyeonggi-do (KR)

(72) Inventor: Yong-Sik Jung, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 208 days.

(21) Appl. No.: 15/412,626

(22) Filed: Jan. 23, 2017

(65) Prior Publication Data

US 2017/0237973 A1 Aug. 17, 2017

(30) Foreign Application Priority Data

Feb. 11, 2016 (KR) .................... 10-2016-0015602

(51) Int. Cl.
| | |
|---|---|
| *H04N 13/305* | (2018.01) |
| *H04N 13/324* | (2018.01) |
| *H04N 13/359* | (2018.01) |
| *H01L 51/52* | (2006.01) |
| *G02B 27/22* | (2018.01) |
| *H04N 13/356* | (2018.01) |
| *H01L 27/32* | (2006.01) |

(52) U.S. Cl.
CPC ....... *H04N 13/305* (2018.05); *G02B 27/2214* (2013.01); *H01L 51/524* (2013.01); *H01L 51/5275* (2013.01); *H04N 13/324* (2018.05); *H04N 13/356* (2018.05); *H04N 13/359* (2018.05); *H01L 27/3211* (2013.01); *H04N 2213/001* (2013.01)

(58) Field of Classification Search
CPC .... H04N 13/305; H04N 13/359; H04N 13/31; H04N 13/356; H04N 13/324; H04N 2013/405; H04N 13/275; H04N 13/122; H04N 13/183; H04N 13/337; G02B 27/2214; G02B 3/005; G02B 3/0062; G02B 27/2228; G02B 27/2242; G02B 1/041; G02B 27/225; G03B 21/625
USPC ...... 348/51, 58, 60; 359/455, 462, 463, 466, 359/621, 642
See application file for complete search history.

(56) References Cited

U.S. PATENT DOCUMENTS

2008/0225373 A1* 9/2008 Hamagishi ........... H04N 13/359
359/240
2009/0262420 A1* 10/2009 Yun ...................... H04N 13/305
359/463
2009/0273834 A1* 11/2009 Korenaga ............ G02B 5/1885
359/463

(Continued)

FOREIGN PATENT DOCUMENTS

| KR | 10-2005-0087251 A | 8/2005 |
|---|---|---|
| KR | 10-2009-0126597 A | 12/2009 |

(Continued)

*Primary Examiner* — Nathnael Aynalem
(74) *Attorney, Agent, or Firm* — Innovation Counsel LLP

(57) ABSTRACT

A display device includes: a first substrate and a second substrate; and a plurality of pixel portions provided between the first substrate and the second substrate, wherein the second substrate includes a plurality of lenticular lens portions, and each of the plurality of lenticular lens portions includes: a curved portion corresponding to a first pixel portion among the plurality of pixel portions; and a plane portion corresponding to a second pixel portion that neighbors the first pixel portion among the plurality of pixel portions.

16 Claims, 8 Drawing Sheets

(56) References Cited

U.S. PATENT DOCUMENTS

| | | | |
|---|---|---|---|
| 2011/0032438 A1* | 2/2011 | Yun | H04N 13/317 349/15 |
| 2012/0069156 A1* | 3/2012 | Miyauchi | G02B 27/2214 348/51 |
| 2013/0249976 A1* | 9/2013 | Kunieda | G09G 3/003 345/698 |
| 2013/0335649 A1* | 12/2013 | Mather | G02F 1/1323 349/15 |
| 2015/0185489 A1* | 7/2015 | Jin | H04N 13/305 359/463 |

FOREIGN PATENT DOCUMENTS

| | | |
|---|---|---|
| KR | 10-2013-0124488 A | 11/2013 |
| KR | 10-2015-0080187 A | 7/2015 |

* cited by examiner

DISPLAY DEVICE

CROSS-REFERENCE TO RELATED APPLICATION

This application claims priority to and the benefit of Korean Patent Application No. 10-2016-0015602 filed in the Korean Intellectual Property Office on Feb. 11, 2016, the entire contents of which are incorporated herein by reference.

BACKGROUND (a) Field

Embodiments of the present invention relate to a display device. More particularly, they relate to a display device that can display a 2D image and a 3D image.

(b) Description of the Related Art

Recently, a 3-dimensional (3D) display device that generates a 3D image based on parallax has been researched and developed. The 3D image display device enables respective eyes of a viewer to view different images, and the viewer can recognize a 3D image by combining the two different images viewed by the eyes of the viewer.

Methods for generating a 3D image effect include a method using a lenticular lens. A light path of a left-eye image and a light path of a right-eye image displayed in the display device are changed by using lenticular lens such that the left-eye image can be viewed by the left eye of the viewer and the right-eye image can be viewed by the right eye of the user.

In order to realize a 3D image effect by using the lenticular lens, an additional lens panel generally needs to be provided in the display device. Accordingly, the entire thickness of the display device is increased.

In addition, when the lens panel is provided as a film that includes a lenticular lens shape, only a 3D image is displayed, and a 2D image cannot be displayed. On the other hand, a driving panel in which a lens panel can generate a lenticular lens shape can display both a 2D image and a 3D image, but the driving panel needs to be controlled according to an image to be displayed, and power consumption is increased for driving of the driving panel.

The above information disclosed in this Background section is only for enhancement of understanding of the background of the invention, and therefore, it may contain information that does not form the prior art that is already known in this country to a person of ordinary skill in the art.

SUMMARY

Embodiments of the present invention have been made in an effort to provide a display device that can recognize a 3D image through refraction of lens and can display a 2D image and a 3D image without using an additional lens panel.

A display device according to an exemplary embodiment of the present invention includes: a first substrate and a second substrate; and a plurality of pixel portions provided between the first substrate and the second substrate, wherein the second substrate includes a plurality of lenticular lens portions, and each of the plurality of lenticular lens portions includes: a curved portion corresponding to a first pixel portion among the plurality of pixel portions; and a plane portion corresponding to a second pixel portion that neighbors the first pixel portion among the plurality of pixel portions.

The first substrate may be a lower substrate that supports the plurality of pixel portions, and the second substrate may be an encapsulation substrate that protects the plurality of pixel portions.

The plurality of lenticular lens portions may be provided in one side of the second substrate facing the first substrate, and the other side of the second substrate may be a plane side.

The curved portion may face the first pixel portion and the plane portion faces the second pixel portion.

The first pixel portion may emit light that passes through the curved portion to display a 3D image, and the second pixel portion may emit light that passes the plane portion to display a 2D image.

The first pixel portion and the second pixel portion that correspond to a single lenticular lens portion may emit light of the same color.

The first pixel portions and the second pixel portions may be alternately arranged in the first direction.

The second pixel portions may include a first 2D pixel portion that emits light of a first color, a second 2D pixel portion that emits light of a second color, and a third 2D pixel portion that emits light of a third color, and the second pixel portions may be arranged in the order of the first 2D pixel portion, the second 2D pixel portion, and the third 2D pixel portion in the first direction.

The first pixel portions may include a first left-eye pixel portion and a first right-eye pixel portion that emit light of the first color, a second left-eye pixel portion and a second right-eye pixel portion that emit light of the second color, and a third left-eye pixel portion and a third right-eye pixel portion that emit light of the third color, and the plurality of first pixel portions may be arranged in the order of the first left-eye pixel portion, the second right-eye pixel portion, the third left-eye pixel portion, the first right-eye pixel portion, the second left-eye pixel portion, and the third right-eye pixel portion in the first direction.

The second pixel portion may maintain a turn-off state concurrently with the first pixel portion being driven to display the 3D image.

The first pixel portion may maintain a turn-off state concurrently with the second pixel portion being driven to display the 2D image.

Light emitted from the plurality of pixel portions may pass through the first substrate and may display a 2D image.

One side of the second substrate disposed facing the first substrate may be a plane side, and the plurality of lenticular lens portions may be provided in the other side of the second substrate.

The second substrate may be a lower substrate that supports the plurality of pixel portions, and the first substrate may be an encapsulation substrate that protects the plurality of pixel portions.

One side of the second substrate disposed facing the first substrate may be a plane side, and the plurality of lenticular lens portions may be provided in the other side of the second substrate.

Each of the plurality of pixel portions may include an organic light emitting diode.

A display device according to another exemplary embodiment of the present invention includes: a lower substrate; a plurality of pixel portions provided on the lower substrate; and an encapsulation substrate disposed facing the lower substrate and protecting the plurality of pixel portions, wherein the encapsulation substrate comprises a plurality of lenticular lens portions, and each of the plurality of lenticular lens portions may include: a first curved portion that corresponds to a left-eye pixel portion; and a second curved portion that corresponds to a right-eye pixel portion that neighbors the left-eye pixel portion.

The first curved portion and the second curved portion may form a single lenticular lens portion.

The plurality of lenticular lens portions may be provided in one side of the encapsulation substrate facing the lower substrate, and the other side of the encapsulation substrate may be a plane side.

The left-eye pixel portion may emit light that passes through the first curved portion to display a left-eye image, and the right-eye pixel portion may emit light that passes through the second curved portion to display a right-eye image.

According to the exemplary embodiments of the present invention, an additional lens panel is not needed for lenticular lens in a display device that can recognize a 3D image through refraction of lens, thereby reducing the entire thickness of the 3D image display device.

Further, a 2D image and a 3D image can be displayed without controlling a driving panel for generation of the lenticular lens.

DETAILED DESCRIPTION

Figure 1:
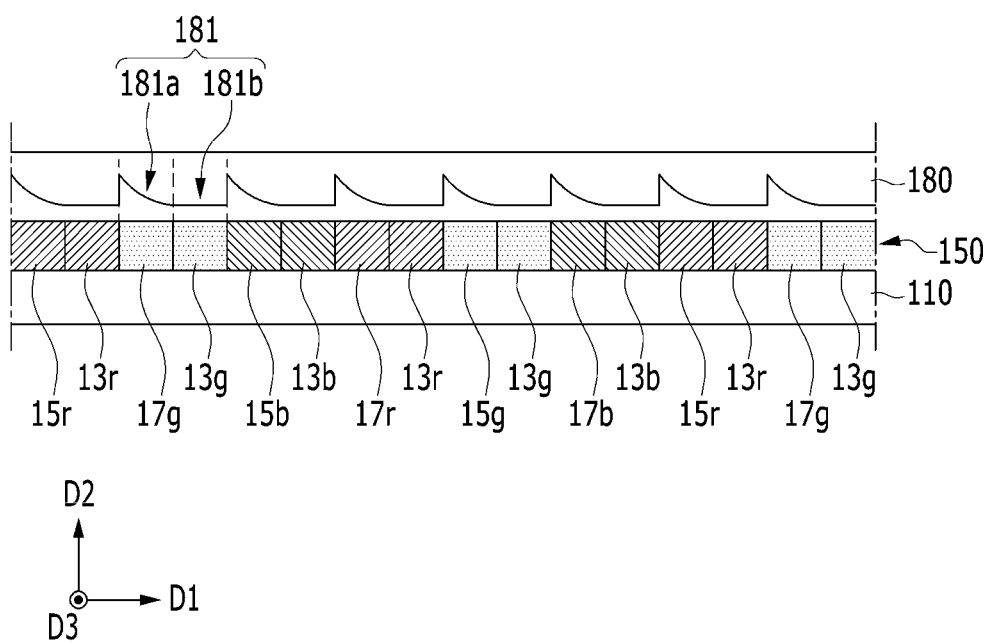
FIG. 1 is a cross-sectional view of a display device according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in the exemplary embodiments, since like reference numerals designate like elements having the same configuration, a first exemplary embodiment is representatively described, and in other exemplary embodiments, only different configurations from the first exemplary embodiment will be described.

Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

Hereinafter, a display device that can display a 2D image and a 3D image according to an exemplary embodiment of the present invention will be described in detail with reference to FIG. 1.

FIG. 1 is a cross-sectional view of a display device according to an exemplary embodiment of the present invention.

Referring to FIG. 1, a display device includes a lower substrate 110, an encapsulation substrate 180 that is disposed facing the lower substrate 110, and an emission element layer 150 disposed between the lower substrate 110 and the encapsulation substrate 180.

The emission element layer 150 is disposed on the lower substrate 110, and the lower substrate 110 supports the emission element layer 150. The lower substrate 110 may be a flat substrate that is made of glass, plastic, and the like. The lower substrate 110 may be a transparent flat substrate.

The emission element layer 150 includes a plurality of pixel portions 13r, 13g, 13b, 15r, 15g, 15b, 17r, 17g, and 17b. Each of the plurality of pixel portions 13r, 13g, 13b, 15r, 15g, 15b, 17r, 17g, and 17b may correspond to one pixel. The pixel is a unit for displaying an image, and each pixel may emit light of a luminance that corresponds to each of primary colors.

The plurality of pixel portions 13r, 13g, 13b, 15r, 15g, 15b, 17r, 17g, and 17b may be organic light emitting elements that include an organic light emitting diode (OLED). The organic light emitting element may emit light of one of the primary colors. The primary colors exemplarily include red, green, and blue, and the three primary colors are spatially or temporally combined to obtain a desired color. Some organic light emitting element OLED may emit white light depending on an exemplary embodiment of the present invention, and accordingly luminance is increased.

The organic light emitting element may include a first electrode, an organic emission layer, and a second layer that are sequentially stacked along a cross-sectional direction D2 of the display device of FIG. 1 on the lower substrate 110. The organic light emitting element may have a well-known structure, and therefore no further description will be provided.

The plurality of pixel portions 13r, 13g, 13b, 15r, 15g, 15b, 17r, 17g, and 17b include first pixel portions 15r, 15g, 15b, 17r, 17g, and 17b that display a 3D image, and a plurality of second pixel portions 13r, 13g, and 13b that display a 2D image.

The encapsulation substrate 180 covers the emission element layer 150 to prevent external oxygen and moisture from entering into the emission element layer 150 to thereby protect the emission element layer 150. Although it is not illustrated, the lower substrate 110 is bonded with an edge of the encapsulation substrate 180 to seal the emission element layer 150 between the encapsulation substrate 180 and the lower substrate 110. The encapsulation substrate 180 may be made of transparent glass, plastic, and the like.

The encapsulation substrate 180 includes a plurality of lenticular lens portions 181. The plurality of lenticular lens portions 181 are provided in one side of the encapsulation substrate 180 facing the lower substrate 110 among sides of the encapsulation substrate 180, and the other side of the encapsulation substrate 180 may be made flat.

Each of the plurality of lenticular lens portions 181 includes a curved portion 181a and a plane portion 181b. The curved portion 181a and the plane portion 181b form a single lenticular lens portion 181.

The curved portion 181a has a shape that is bent with a predetermined curvature radius. The curved portion 181a may have a shape that is convex toward the lower substrate 110. The plane portion 181b may have a shape that is parallel to the surface of the lower substrate 110.

The plurality of lenticular lens portions 181 are arranged in a first direction D1. In FIG. 1, a second direction D2 is perpendicular to the first direction D1, that is, substantially perpendicular to the surface of the lower substrate 110, and a third direction D3 is perpendicular to the first direction D1 and the second direction D2.

A curved portion 181a of one of the plurality of lenticular lens portions 181 may be connected with a plane portion 181b of another lenticular lens portion 181 through a vertical continuous surface that is parallel with the second direction D2 and the third direction D3.

A curved portion 181a of each of the plurality of lenticular lens portions 181 corresponds to at least one first pixel portion among 15r, 15g, 15b, 17r, 17g, and 17b displaying a 3D image, and the plane portion 181b corresponds at least one second pixel portion among 13r, 13g, and 13b displaying a 2D image. The curved portion 181a of each of the plurality of lenticular lens portions 181 may face at least one of the first pixel portions 15r, 15g, 15b, 17r, 17g, and 17b, and the plane portion 181b may face at least one of the second pixel portions 13r, 13g, and 13b. The first pixel portions 15r, 15g, 15b, 17r, 17g, and 17b may display a 3D image by emitting light that passes through the curved portion 181a that faces thereto, and the second pixel portions 13r, 13g, and 13b may display a 2D image by emitting light that passes through the plane portion 181b that faces thereto.

The first pixel portions 15r, 15g, 15b, 17r, 17g, and 17b and the second pixel portions 13r, 13g, and 13b may be alternately arranged in the first direction D1. A first pixel portion 17g and a second pixel portion 13g that correspond to one lenticular lens portion 181 may emit light of the same color.

The first pixel portions 15r, 15g, 15b, 17r, 17g, and 17b may include a plurality of emission elements, each representing a different color, and for example, may include a first left-eye pixel portion 15r and a first right-eye pixel portion 17r emitting light of a red color, a second left-eye pixel portion 15g and a second right-eye pixel portion 17g emitting light of a green color, and a third left-eye pixel portion 15b and a third right-eye pixel portion 17b emitting light of a blue color. In addition, the second pixel portions 13r, 13g, and 13b may also include a plurality of emitting elements, each representing a different color, and for example, may include a first 2D pixel portion 13r emitting light of a red color, a second 2D pixel portion 13g emitting light of a green color, and a third 2D pixel portion 13b emitting light of a blue color. In this case, the first 2D pixel portion 13r, the second 2D pixel portion 13g, and the third 2D pixel portion 13b are sequentially arranged in the first direction D1. Further, the plurality of first pixel portions 15r, 15g, 15b, 17r, 17g, and 17b are arranged in the order of the first left-eye pixel portion 15r, the second right-eye pixel portion 17g, the third left-eye pixel portion 15b, the first right-eye pixel portion 17r, the second left-eye pixel portion 15g, and third right-eye pixel portion 17b.

In FIG. 1, the display device is exemplarily described as an organic light emitting display. As in the display device of FIG. 1, an encapsulation substrate of a liquid crystal display may include a plurality of lenticular lens portions 181. This will be described with reference to FIG. 2.

Figure 2:
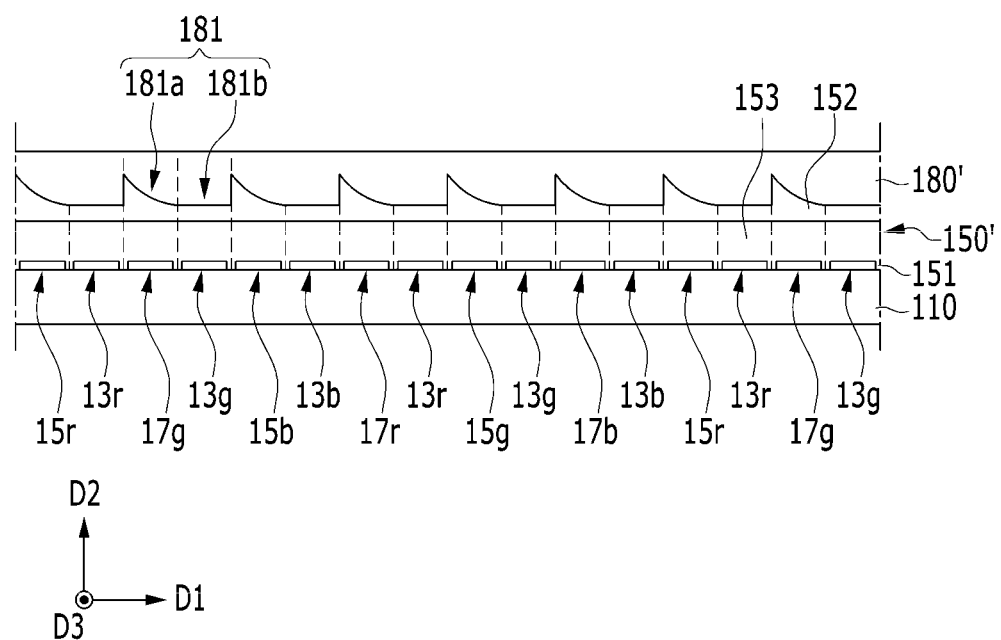
FIG. 2 is a cross-sectional view of a display device according to another exemplary embodiment of the present invention.

FIG. 2 is a cross-sectional view of a display device according to another exemplary embodiment of the present invention.

Referring to FIG. 2, a display device includes a lower substrate 110, an upper substrate 180' disposed facing the lower substrate 110, and a pixel layer 150' disposed between the lower substrate 110 and the upper substrate 180'.

The pixel layer 150' includes a plurality of pixel portions 13r, 13g, 13b, 15r, 15g, 15b, 17r, 17g, and 17b. Each of the plurality of pixel portions 13r, 13g, 13b, 15r, 15g, 15b, 17r, 17g, and 17b may correspond to one pixel. Each of the plurality of pixel portions 13r, 13g, 13b, 15r, 15g, 15b, 17r, 17g, and 17b includes a pixel electrode 151 disposed on the lower substrate 110, a common electrode 152 provided on the upper substrate 180', and a liquid crystal layer 153 provided between the pixel electrode 151 and the common electrode 152. Here, the common electrode 152 is described to be disposed on the upper substrate 180' in the present exemplary embodiment, but the pixel electrode 151 and the common electrode 152 may be disposed with various well-known structures.

A backlight (not shown) may be disposed in a rear side of the lower substrate 110. In addition, the plurality of pixel portions 13r, 13g, 13b, 15r, 15g, 15b, 17r, 17g, and 17b may include a color filter (not shown) representing one of primary colors. Light emitted from the backlight passes through the plurality of pixel portions 13r, 13g, 13b, 15r, 15g, 15b, 17r, 17g, and 17b. In this case, the plurality of pixel portions 13r, 13g, 13b, 15r, 15g, 15b, 17r, 17g, and 17b may generate light of one of the primary colors by the color filters.

The upper substrate 180' includes a plurality of lenticular lens portions 181. The upper substrate 180' may be made of transparent glass, plastic, and the like.

The shape and alignment of the lenticular lens portions 181 and the shape and alignment of the plurality of pixel portions 13r, 13g, 13b, 15r, 15g, 15b, 17r, 17g, and 17b are the same as those in FIG. 1, and therefore will not be further described.

As described above, the plurality of pixel portions 13r, 13g, 13b, 15r, 15g, 15b, 17r, 17g, and 17b may be organic light emitting elements as described with reference to FIG. 1, or may be pixels, each including a pixel electrode 151, a common electrode 152, and a liquid crystal layer 153 of the liquid crystal display as described with reference to FIG. 2. This is the same as in a display to be described hereinafter.

Hereinafter, a plurality of pixel portions 13r, 13g, 13b, 15r, 15g, 15b, 17r, 17g, and 17b are exemplarily illustrated as organic light emitting elements.

Hereinafter, referring to FIG. 3, a method for displaying a 3D image on an encapsulation substrate 180 of a display device will be described.

Figure 3:
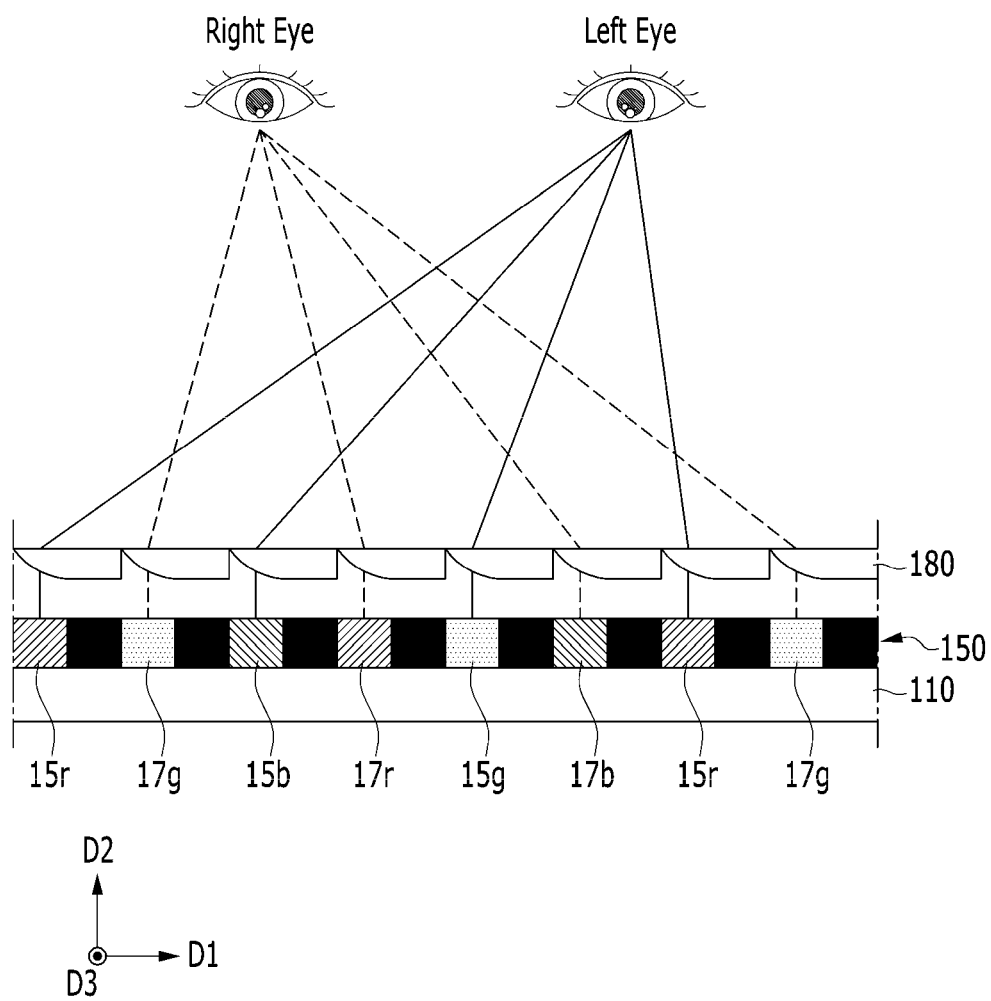
FIG. 3 shows a method for displaying a 3D image to an encapsulation substrate by the display device according to an exemplary embodiment of the present invention.

FIG. 3 shows a method for displaying a 3D image on an encapsulation substrate of the substrate according to the present exemplary embodiment.

Referring to FIG. 3, when the display device is in a 3D mode for displaying a 3D image, a plurality of first pixel portions 15r, 15g, 15b, 17r, 17g, and 17b are driven to emit light for displaying the 3D image, and a plurality of second pixel portions 13r, 13g, and 13b maintain turn-off states.

A light path of the light emitted from the plurality of first pixel portions 15r, 15g, 15b, 17r, 17g, and 17b changes while passing through a curved portion 181a of the encapsulation substrate 180. In particular, a light path of the light emitted from the first left-eye pixel portion 15r, the second left-eye pixel portion 15g, and the third left-eye pixel portion 15b changes while passing through the encapsulation substrate 180 such that the light is viewed by the left eye of the viewer. A light path of the light emitted from the first right-eye pixel portion 17r, the second right-eye pixel portion 17g, and the third right-eye pixel portion 17b changes while passing through the encapsulation substrate 180 such that the light is viewed by the right eye of the viewer. The left eye and the right eye of the viewer respectively view different images, and accordingly, the viewer can view a 3D image.

Hereinafter, referring to FIG. 4, a method for displaying a 2D image on the encapsulation substrate 180 of the display device will be described.

Figure 4:
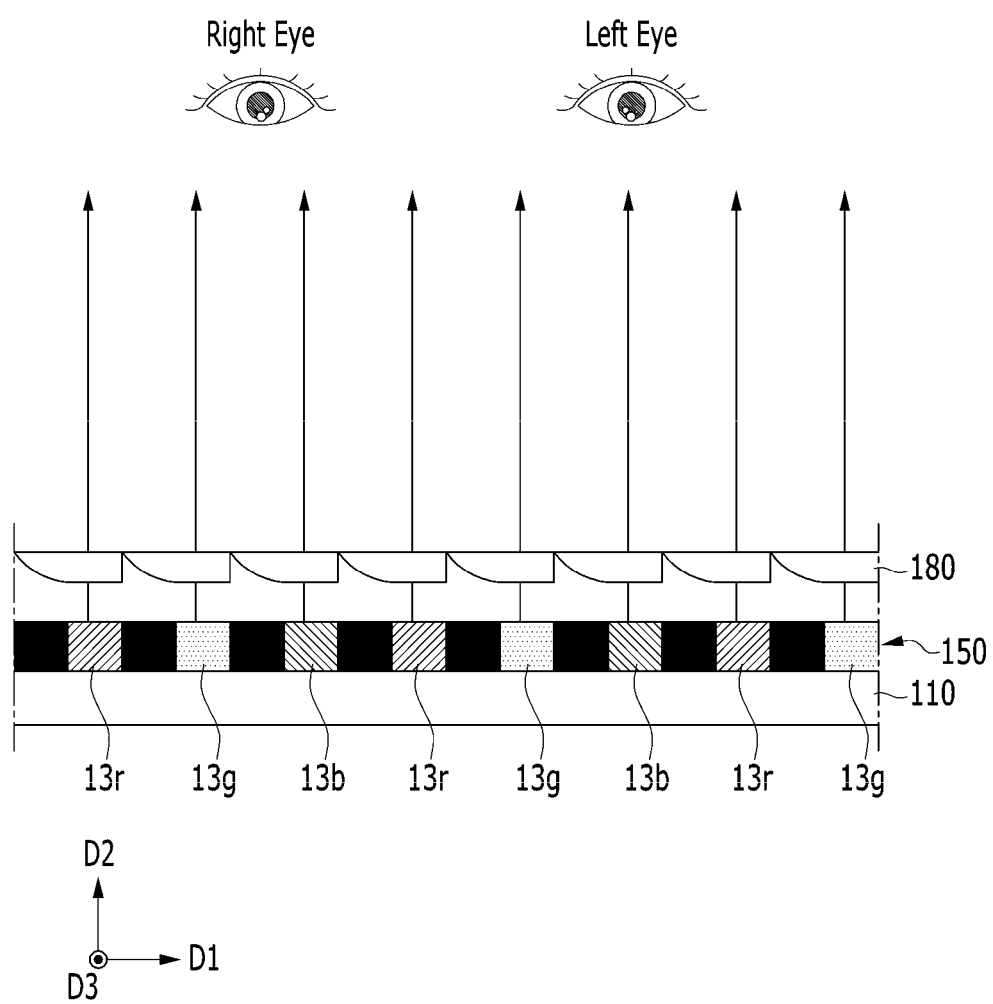
FIG. 4 shows a method for displaying a 2D image to a lower substrate by the display device according to the exemplary embodiment of the present invention.

FIG. 4 shows a method for displaying a 2D image on the encapsulation substrate 180 of the display device.

Referring to FIG. 4, when the display device is in a first 2D mode that displays a 2D image on the encapsulation substrate 180 of the display device, the plurality of second pixel portions 13r, 13g, and 13b are driven to emit light for displaying a 2D, and the plurality of first pixel portions 15r, 15g, 15b, 17r, 17g, 17b maintain turn-off states.

Light emitted from the plurality of second pixel portions 13r, 13g, and 13b directly passes through the plane portion 181b of the encapsulation substrate 180. That is, light emitted from the plurality of second pixel portions 13r, 13g, and 13b directly passes through the plane portion 181b to be viewed by both eyes of the viewer, and its light path is not changed by the plane portion 181b. Thus, the left eye and the right eye of the viewer view the same image, so the viewer can view a 2D image.

As described with reference to FIG. 3 and FIG. 4, a 3D image or a 2D image may be displayed in a front direction (i.e., a direction of the encapsulation substrate 180) D2 of the display device. Further, the display device may display a 2D image in a rear side direction (i.e., a direction of the lower substrate 110; a direction opposite to D2). That is, the display device may be a dual-sided emission type of display device that can display an image in a front direction and a rear direction.

Hereinafter, referring to FIG. 5, a method for displaying a 2D image on the lower substrate 110 of the display device will be described.

Figure 5:
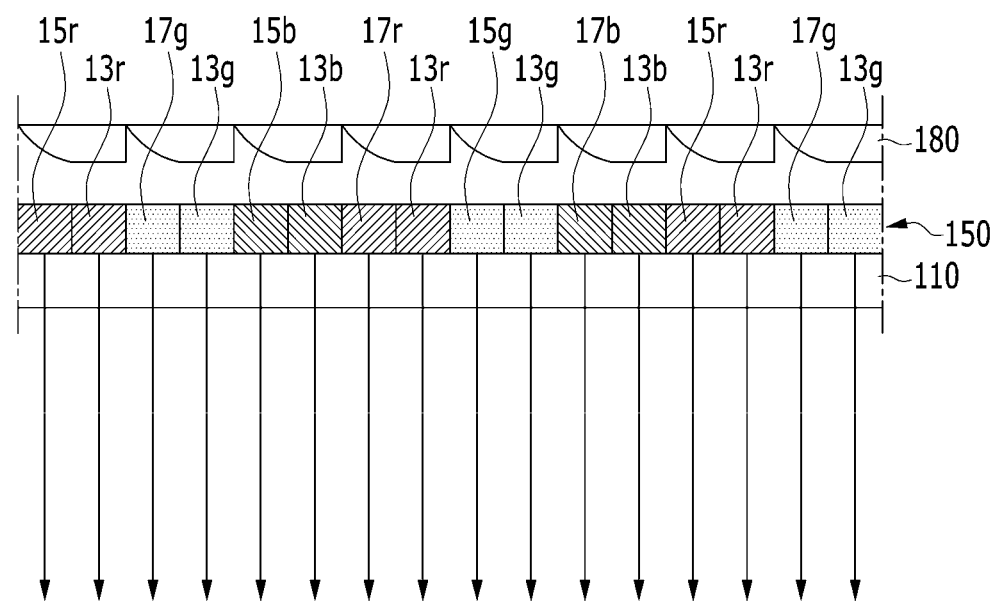
FIG. 5 shows a method for displaying a 2D image to a lower substrate by the display device according to the exemplary embodiment of the present invention.

FIG. 5 shows a method for displaying a 2D image on the lower substrate of the display device according to the exemplary embodiment of the present invention.

Referring to FIG. 5, the lower substrate 110 is provided as a transparent substrate, and light emitted from the plurality of pixel portions 13r, 13g, 13b, 15r, 15g, 15b, 17r, 17g, and 17b may pass through the lower substrate 110.

When the display device is in a second 2D mode to display a 2D image on the lower substrate 110, the plurality of first pixel portions 15r, 15g, 15b, 17r, 17g, and 17b and the plurality of second pixel portions 13r, 13g, and 13b may be driven to emit light for displaying a 2D image. Depending on an exemplary embodiment, when the display device is in the second 2D mode, one of the plurality of pixel portions 15r, 15g, 15b, 17r, 17g, and 17b and the plurality of second pixel portions 13r, 13g, and 13b may emit light and the other may maintain a turn-off state.

Since the lower substrate 110 has a flat portion and does not include a curved portion, light emitted from the plurality of pixel portions 13r, 13g, 13b, 15r, 15g, 15b, 17r, 17g, and 17b directly passes through the lower substrate 110 to be viewed by both eyes of the viewer, and its light path is not changed by the lower substrate 110. Thus, the left eye and the right eye of the viewer view the same image so that the viewer can view a 2D image.

The display device may generate a 2D image of the second 2D mode by reversing a 2D image displayed as the first 2D mode from side to side.

Hereinafter, referring to FIG. 6, a display device according to another exemplary embodiment of the present invention will be described. Differences from the display device of FIG. 1 will be mainly described.

Figure 6:
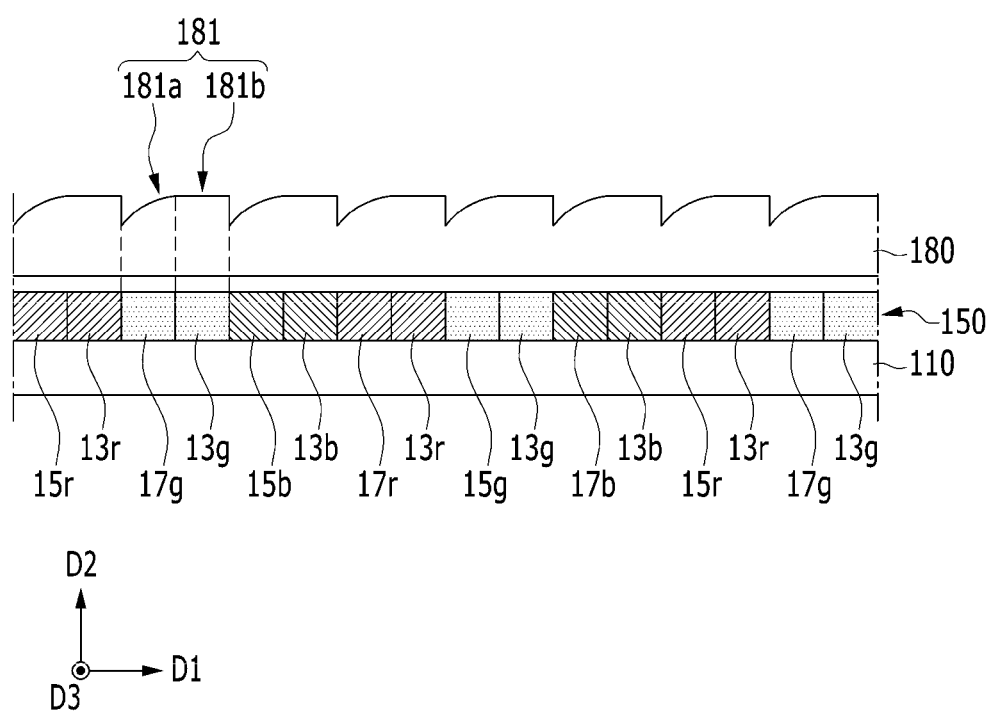
FIG. 6 is a cross-sectional view of a display device according to another exemplary embodiment of the present invention.

FIG. 6 is a cross-sectional view of a display device according to another exemplary embodiment of the present invention.

Referring to FIG. 6, one side of an encapsulation substrate 180 that is disposed facing a lower substrate 110 is a plane side, and a plurality of lenticular lens portions 181 are provided in the other side of the encapsulation substrate 180. A curved portion 181a of each of the plurality of lenticular lens portions 181 has a shape that is convex toward a second direction D2, which is the opposite direction of the lower substrate 110.

Except that the plurality of lenticular lens portions 181 are provided in the other side of the encapsulation substrate 180, the display device of FIG. 6 is the same as the display device of FIG. 1, and therefore no further description of other constituent elements will be provided.

In addition, when the plurality of lenticular lens portions 181 are provided in the other side of the encapsulation substrate 180, a 3D image can be displayed by the same process as described with reference to FIG. 3, a 2D image can be displayed in the encapsulation substrate 180 by the same process as described with reference to FIG. 4, and a 2D image may be displayed in the lower substrate 110 by the same method as described with reference to FIG. 5.

Hereinafter, referring to FIG. 7, a display device according to another exemplary embodiment of the present invention will be described. Differences from the display device of FIG. 1 will be mainly described.

Figure 7:
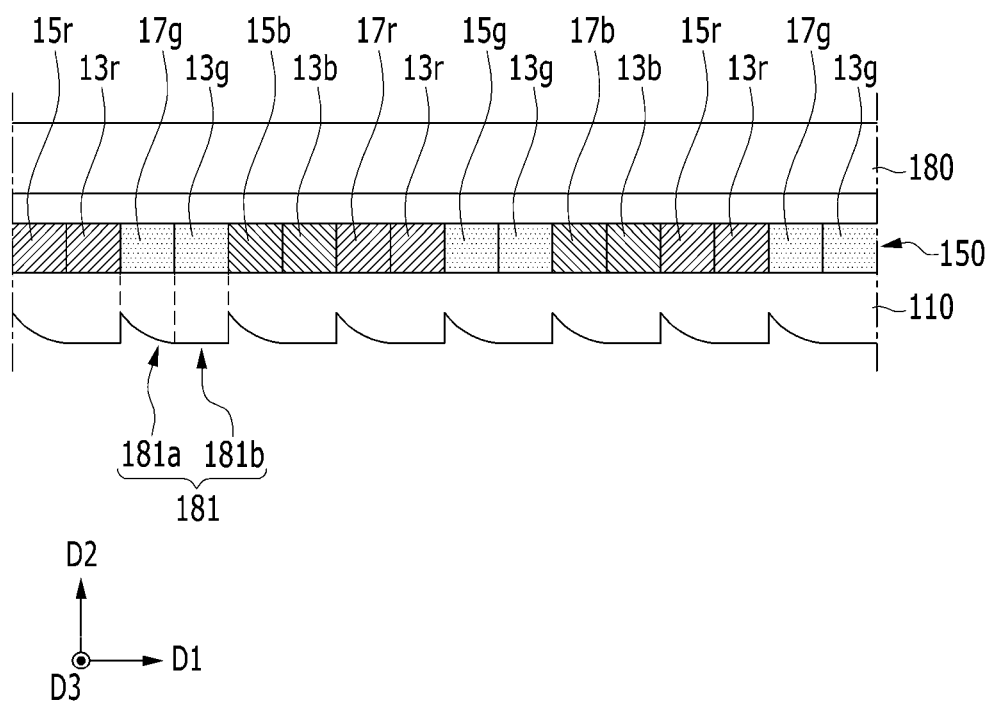
FIG. 7 is a cross-sectional view of a display device according to another exemplary embodiment of the present invention.

FIG. 7 is a cross-sectional view of a display device according to another exemplary embodiment of the present invention.

Referring to FIG. 7, an encapsulation substrate 180 that covers an emission element layer 150 is provided as a plane substrate, and a lower substrate 110 includes a plurality of lenticular lens portions 181. One side of the lower substrate 110, disposed facing the encapsulation substrate 180, is a plane side, and the plurality of lenticular lens portions 181 are provided in the other side of the lower substrate 110. A curved portion 181a of each of the plurality of lenticular lens portions 181 has a shape that is convex toward the opposite direction of the encapsulation substrate 180, that is, the opposite direction of a second direction D2. A plane portion 181b of each of the plurality of lenticular lens portions 181 may have a plane shape that is parallel with the surface of the encapsulation substrate 180. A curved portion 181a of one of the plurality of lenticular lens portions 181 and a plane portion 181b of a neighboring one of the plurality of lenticular lens portions 181 may be connected with each other through a perpendicularly continuous surface that is parallel with the second direction D2 and a third direction D3.

Since the plurality of lenticular lens portions 181 are included not in the encapsulation substrate 180 but in the lower substrate 110, a 3D image is displayed to the lower substrate 110. That is, a light path of the light emitted from a first left-eye pixel portion 15r, a second left-eye pixel portion 15g, and a third left-eye pixel portion 15b changes while passing through the lower substrate 110, and thus, the light is viewed by the left eye of the viewer; similarly, a light path of light emitted from a first right-eye pixel portion 17r, a second right-eye pixel portion 17g, and a third right-eye pixel portion 17b changes while passing through the lower substrate 110, and thus, the light is viewed by the right eye of the viewer. In this case, the plurality of second pixel portions 13r, 13g, and 13b maintain turn-off states.

In addition, when the display device is in a first 2D mode, and thus, a 2D image is displayed to the encapsulation substrate 180, the plurality of first pixel portions 15r, 15g, 15b, 17r, 17g, and 17b and the plurality of second pixel portions 13r, 13g, and 13b may be driven to emit light for displaying a 2D image. Depending on an exemplary embodiment of the present invention, one of the plurality of first pixel portions 15r, 15g, 15b, 17r, 17g, and 17b and the plurality of second pixel portions 13r, 13g, and 13b is driven to emit light, and the other one may maintain the turn-off state. Since the encapsulation substrate 180 has a flat portion, light emitted from the plurality of pixel portions 13r, 13g, 13b, 15r, 15g, 15b, 17r, 17g, and 17b directly passes the encapsulation substrate 180 to be viewed by both eyes of the viewer, and its light path is not changed by the encapsulation substrate 180.

When the display device is in a second 2D mode, and thus, a 2D image is displayed to the lower substrate 110, the plurality of second pixel portions 13r, 13g, and 13b are driven to emit light for displaying a 2D image, and the plurality of first pixel portions 15r, 15g, 15b, 17r, 17g, and 17b maintain the turn-off states. The light emitted from the plurality of second pixel portions 13r, 13g, and 13b directly passes through the plane portion 181b of the lower substrate 100 and is thus viewed by both eyes of the viewer.

Hereinafter, referring to FIG. 8, a display device according to another exemplary embodiment of the present invention will be described. Differences from the display device of FIG. 1 will be mainly described.

Figure 8:
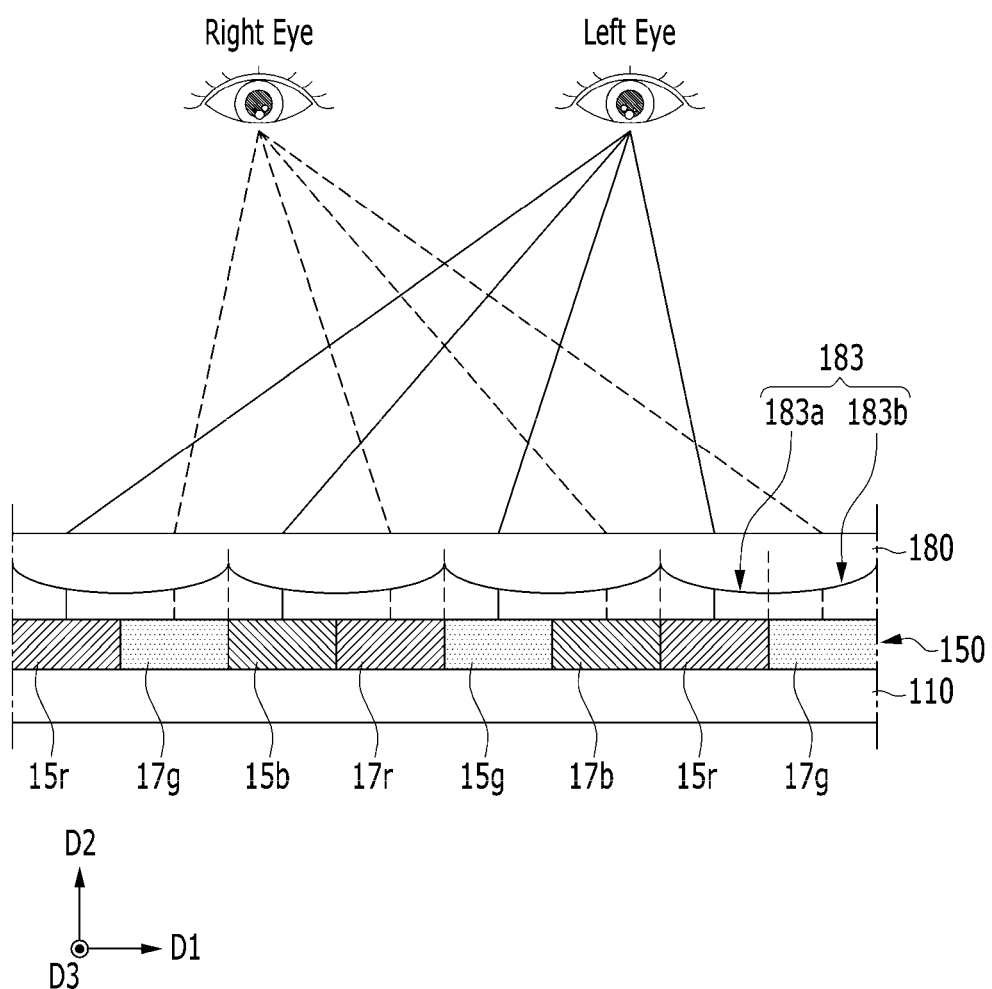
FIG. 8 is a cross-sectional view of a display device according to another exemplary embodiment of the present invention.

FIG. 8 is a cross-sectional view of a display device according to another exemplary embodiment of the present invention.

Referring to FIG. 8, an emission element layer 150 disposed between a lower substrate 110 and an encapsulation substrate 180 that are disposed facing each other includes a plurality of pixel portions 15r, 15g, 15b, 17r, 17g, and 17b. The plurality of pixel portions 15r, 15g, 15b, 17r, 17g, and 17b include left-eye pixel portions 15r, 15g, and 15b and right-eye pixel portions 17r, 17g, and 17b. The left-eye pixel portions and the right-eye pixel portions are provided for displaying a 3D image.

The encapsulation substrate 180 includes a plurality of lenticular lens portions 183. The plurality of lenticular lens portions 183 are provided in one side of the encapsulation substrate 180 facing the lower substrate 110, and the other side of the encapsulation substrate 180 may be provided as a plane side. The lenticular lens portions 183 may be convex toward the lower substrate 110.

Each of the plurality of lenticular lens portions 183 includes a first curved portion 183a that corresponds to at least one of left-eye pixel portions 15r, 15g, and 15b and a second curved portion 183b that corresponds to at least one of right-eye pixel portions 17r, 17g, and 17b. The first curved portion 183a and the second curved portion 183b form a single convex-shaped lenticular lens portion 183.

The first curved portion 183a may face at least one of the left-eye pixel portions 15r, 15g, and 15b, and the second curved portion 183b may face at least one of the right-eye pixel portions 17r, 17g, and 17b. The left-eye pixel portions 15r, 15g, and 15b may display a left-eye image by emitting light that passes the first curved portions 183a that face thereto, and the right-eye pixel portions 17r, 17g, and 17b may display a right-eye image by emitting light that passes the second curved portions 183b.

The plurality of lenticular lens portions 183 are arranged in a first direction D1. The left-eye pixel portions 15r, 15g, and 15b and the right-eye pixel portions 17r, 17g, and 17b may be alternately arranged in the first direction D1, and the left-eye pixel portions 15r, 15g, and 15b and the right-eye pixel portions 17r, 17g, and 17b that respectively neighbor each other may emit light of different colors.

For example, the left-eye pixel portions 15r, 15g, and 15b may include a first left-eye pixel portion 15r that emits light of a red color, a second left-eye pixel portion 15g that emits light of a green color, and a third left-eye pixel portion 15b that emits light of a blue color. In addition, the right-eye pixel portions 17r, 17g, and 17b may include a first right-eye pixel portion 17r that emits light of a red color, a second right-eye pixel portion 171g that emits light of a green color, and a third right-eye pixel portion 17b that emits light of a blue color. In this case, the plurality of pixel portions 15r, 15g, 15b, 17r, 17g are 17b sequentially arranged in the order of the first left-eye pixel portion 15r, the second right-eye pixel portion 17g, the third left-eye pixel portion 15b, the first right-eye pixel portion 17r, the second left-eye pixel portion 15g, and the third right-eye pixel portion 17b in the first direction D1.

Light emitted from the plurality of left-eye pixel portions 15r, 15g, and 15b passes through the first curved portions 183a and is then viewed by the left eye of the viewer, and light emitted from the plurality of right-eye pixel portions 17r, 17g, and 17b passes through the second curved portions 183b and is then viewed by the right eye of the viewer. The left eye and the right eye of the viewer view different images such that the viewer can watch a 3D image.

Here, the plurality of lenticular lens portions 183 are exemplarily provided in one side of the encapsulation substrate 180 facing the lower substrate 110, but depending on an exemplary embodiment of the present invention, the plurality of lenticular lens portions 183 may be provided in the other side of the encapsulation substrate 180 and the one side of the encapsulation substrate 180 facing the lower substrate 110.

Further, the plurality of lenticular lens portions 183 are exemplarily provided in the encapsulation substrate 180, but depending on an exemplary embodiment of the present invention, the plurality of lenticular lens portions 183 may be provided in the lower substrate 110.

The accompanying drawings and the detailed description of the present invention are illustrated by way of example and are not used to limit the meaning or limit the scope of the present invention described in the claims, but are used to describe the present invention. Therefore, it will be appreciated to those skilled in the art that various modifications can be made and other equivalent embodiments are available. Therefore, a true technical scope of the present invention will be defined by the technical spirit of the appended claims.

DESCRIPTION OF SYMBOLS

110: lower substrate
150: emission element layer
180: encapsulation substrate
181: lenticular lens portion

What is claimed is:

1. A display device comprising:
a first substrate and a second substrate; and
a plurality of pixel portions provided between the first substrate and the second substrate,
wherein the second substrate includes a plurality of lenticular lens portions, and
each of the plurality of lenticular lens portions comprises:
a curved portion corresponding to a first pixel portion among the plurality of pixel portions; and
a plane portion corresponding to a second pixel portion that neighbors the first pixel portion among the plurality of pixel portions, wherein the plane portion is parallel to a surface of the first substrate and overlaps entirely the second pixel portion corresponding to the plane portion.

2. The display device of claim 1, wherein the first substrate is a lower substrate that supports the plurality of pixel portions, and the second substrate is an encapsulation substrate that protects the plurality of pixel portions.

3. The display device of claim 2, wherein the plurality of lenticular lens portions are provided in one side of the second substrate facing the first substrate, and the other side of the second substrate is a plane side.

4. The display device of claim 3, wherein the curved portion faces the first pixel portion and the plane portion faces the second pixel portion.

5. The display device of claim 2, wherein the first pixel portion emits light that passes through the curved portion to display a 3D image, and the second pixel portion emits light that passes the plane portion to display a 2D image.

6. The display device of claim 5, wherein the first pixel portion and the second pixel portion that correspond to a single lenticular lens portion emit light of the same color.

7. The display device of claim 5, the first pixel portions and the second pixel portions are alternately arranged in the first direction.

8. The display device of claim 7, wherein the second pixel portions comprise a first 2D pixel portion that emits light of a first color, a second 2D pixel portion that emits light of a second color, and a third 2D pixel portion that emits light of a third color, and the second pixel portions are arranged in the order of the first 2D pixel portion, the second 2D pixel portion, and the third 2D pixel portion in the first direction.

9. The display device of claim 8, wherein the first pixel portions comprise a first left-eye pixel portion and a first right-eye pixel portion that emit light of the first color, a second left-eye pixel portion and a second right-eye pixel portion that emit light of the second color, and a third left-eye pixel portion and a third right-eye pixel portion that emit light of the third color, and the plurality of first pixel portions are arranged in the order of the first left-eye pixel portion, the second right-eye pixel portion, the third left-eye pixel portion, the first right-eye pixel portion, the second left-eye pixel portion, and the third right-eye pixel portion in the first direction.

10. The display device of claim 5, wherein the second pixel portion maintains a turn-off state concurrently with the first pixel portion being driven to display the 3D image.

11. The display device of claim 10, wherein the first pixel portion maintains a turn-off state concurrently with the second pixel portion being driven to display the 2D image.

12. The display device of claim 4, wherein light emitted from the plurality of pixel portions passes through the first substrate and displays a 2D image.

13. The display device of claim 2, wherein one side of the second substrate disposed facing the first substrate is a plane side, and the plurality of lenticular lens portions are provided in the other side of the second substrate.

14. The display device of claim 1, wherein the second substrate is a lower substrate that supports the plurality of pixel portions, and the first substrate is an encapsulation substrate that protects the plurality of pixel portions.

15. The display device of claim 14, wherein one side of the second substrate disposed facing the first substrate is a plane side, and the plurality of lenticular lens portions are provided in the other side of the second substrate.

16. The display device of claim 1, wherein each of the plurality of pixel portions comprises an organic light emitting diode.

* * * * *